United States Patent Office 3,019,142

Patented Jan. 30, 1962

3,019,142

SEMICONDUCTOR DEVICE

Charles Z. Leinkram, Port Chester, N.Y., assignor to The Bendix Corporation, a corporation of Delaware No Drawing. Filed July 25, 1958, Ser. No. 750,893

4 Claims. (Cl. 148—1.5)

The present invention relates to semiconductor devices and more particularly to a method of producing a semiconductor device by diffusion.

The role of diffusion in the fabrication of semiconductor devices has resulted in devices having improved characteristics, such for example as enabling silicon power rectifiers to handle higher currents and in the drift transistors, higher frequencies.

With the diffusion techniques currently in use it is difficult to attain and control the deep penetration, hence, difficult to obtain uniform results in production. Further, the present processes require complex equipment.

The present invention provides a technique for solid state diffusion which utilizes the limited solubility of the group III and group V oxides in organic or inorganic acids or bases as means for controlling the initial concentration.

It is an object of the present invention to provide an improved method for fabricating semiconductor devices.

Another object of the invention is to provide a novel diffusion method for producing semiconductor devices, which is easily adapted to large scale production with a minimum of equipment and operations.

Another object of the invention is to provide a method of diffusion in which the penetration can be reproduced with extreme accuracy.

Another object of the invention is to provide a method of diffusion in which no objectionable glass formation is present.

Another object of the invention is to provide a novel solid state diffusion method for semiconductors.

The above and other objects and features of the invention will appear more fully hereinafter from a consideration of the following description.

Reproducible and uniform impurity penetration, which will provide flat junctions in semiconductor devices, can only be produced from a uniform planar source concentration. This is accomplished in the present invention by preparing a saturated solution by mixing group III or group V oxides with organic acids, inorganic acids or bases. The mixture is agitated and then allowed to settle. The excess oxides may be removed by filtering. Wafers of semiconductor material, for example silicon or germanium, are then coated with the mixture and allowed to air-dry. After drying, the wafers are fired at a temperature so that the oxides do not alloy but diffuse into the semiconductor wafer. Diffusion is governed by the following:

$$C_{(x,t)}=C_{(x=ot)}erfC\frac{X}{\sqrt{4DT}} \quad (1)$$

where

X is the penetration in millimeters,
D is the diffusion coefficient in square centimeters per second,
T is the temperature in degrees centigrade,
$t$ is the time,
C is the concentration of the mixture.

From the above the time and temperatures for the different oxides and solutions are obtainable.

In a specific example, a saturated solution of antimony trioxide was prepared in which a quantity of chemically pure grade of antimony trioxide ($Sb_2O_3$) was mixed with a chemically pure grade of glacial acetic acid. The mixture was agitated at room temperature and allowed to settle. The saturated solution was filtered and used to coat lapped germanium wafers. The coated wafers were air-dried leaving a thin film of $Sb_2O_3$ thereon. Next, the coated wafers were fired at 900° C. for three hours in a nitrogen atmosphere. This gave an N diffusion into P type germanium of 3.3 mils. At the aforenoted temperature, the germanium reduced the $Sb_2O_3$ very slowly so that the residual antimony diffused into the germanium thusly:

$$Sb_2O_3+3Ge \text{ @ } 900° \text{ C.}=2Sb+3GeO \quad (2)$$

The concentration decreased as the penetration increased, hence, a device utilizing this method as an $N^+N$ or $P^+P$ will have a drift effect.

A batch of germanium wafers were coated with the solution and processed as above except that the firing was in a reducing atmosphere. The penetration was found to be the same as for the nitrogen.

In another specific example, indium hydroxide was mixed with glacial acetic acid, agitated at room temperature, allowed to settle and the excess indium hydroxide filtered out. Lapped semiconductor wafers were coated with the mixture, allowed to air-dry and then fired at 900° C. for a period of three hours.

While specific time and temperature have been given to the specific examples, it is understood that other times and temperatures may be used. They are related to the penetration desired and will vary accordingly.

With the method set forth penetrations have been reproduced to within 0.01 mil. This accuracy of control of reproduced penetrations is possible by maintaining constant the concentration of the solution. Thus, with controlled time and temperature, together with maintaining the concentration of the solution constant, it is possible to reproduce a predetermined penetration.

Although only two specific examples of the invention have been described, various changes in the form and relative arrangement of the parts, which will now appear to those skilled in the art, may be made without departing from the scope of the invention.

What is claimed is:

1. A method for fabricating a semiconductor device, comprising producing a saturated solution by dissolving a quantity of antimony trioxide in glacial acetic acid, coating a semiconductor wafer selected from the group consisting of germanium and silicon with the solution, air-drying said wafer, and firing at 900° C. for three hours.

2. A method for producing a drift transistor comprising preparing a saturated solution by dissolving a quantity of antimony trioxide in glacial acetic acid, coating a semiconductor wafer selected from the group consisting of germanium and silicon with said solution, allowing the coated wafer to air-dry, and firing said wafer at a temperature to reduce the oxide slowly so that the residual base metal diffuses into the wafer.

3. A method for producing a diffused transistor comprising preparing a saturated solution by dissolving a quantity of indium hydroxide in glacial acetic acid, coating a wafer of semiconducting material selected from the group consisting of germanium and silicon with said solution, allowing the coated wafer to air-dry, and firing said coated wafer at a temperature to reduce the oxide slowly so that the residue base element diffuses into the wafer.

4. A method for producing a diffused transistor comprising producing a saturated solution by dissolving a quantity of indium hydroxide in glacial acetic acid, coating a wafer of semiconductor material selected from the group consisting of germanium and silicon material with said solution, air-drying said wafer and firing at 900° C. for three hours.

References Cited in the file of this patent

UNITED STATES PATENTS

| | | |
|---|---|---|
| 2,656,496 | Sparks | Oct. 20, 1953 |
| 2,794,846 | Fuller | June 4, 1957 |
| 2,806,807 | Armstrong | Sept. 17, 1957 |